(12) United States Patent
Fujita et al.

(10) Patent No.: US 8,196,429 B2
(45) Date of Patent: Jun. 12, 2012

(54) METHOD AND APPARATUS FOR MANUFACTURING VITREOUS SILICA CRUCIBLE

(75) Inventors: Takeshi Fujita, Akita (JP); Minoru Kanda, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 170 days.

(21) Appl. No.: 12/303,134

(22) PCT Filed: Jul. 25, 2008

(86) PCT No.: PCT/JP2008/063439
§ 371 (c)(1),
(2), (4) Date: Sep. 22, 2009

(87) PCT Pub. No.: WO2009/017068
PCT Pub. Date: Feb. 5, 2009

(65) Prior Publication Data
US 2010/0229599 A1    Sep. 16, 2010

(30) Foreign Application Priority Data
Jul. 28, 2007  (JP) ................. P2007-196814

(51) Int. Cl.
*C03B 19/01* (2006.01)
(52) U.S. Cl. .......................................... 65/17.3; 65/33.1
(58) Field of Classification Search .................. 65/17.3, 65/33.1
See application file for complete search history.

(56) References Cited

U.S. PATENT DOCUMENTS

| 5,762,672 A  * | 6/1998 | Ikeda et al. ................... 65/17.3 |
| 6,553,787 B1 * | 4/2003 | Akiho et al. .................. 65/17.3 |
| 6,652,934 B1 | 11/2003 | Miyao et al. |

FOREIGN PATENT DOCUMENTS

| JP | 59-34659 | 8/1984 |
| JP | 1-157427 | 6/1989 |
| JP | 9-20586 | 1/1997 |
| JP | 2000-3445369 | 12/2000 |
| JP | 2001-233629 | 8/2001 |
| JP | 2004-002082 | 1/2004 |

OTHER PUBLICATIONS

U.S. Appl. No. 12/169,838, filed Jul. 9, 2008 and entitled "Method for Producing Quartz Glass Crucible".
English language Abstract of JP2004-002082, Jan. 8, 2004.
English language Abstract of JP 9-20586, Jan. 21, 1997.
English language Abstract of JP 1-157427, Jun. 20, 1989.
English language Abstract of JP 2001-233629, Aug. 28, 2001.

\* cited by examiner

*Primary Examiner* — Matthew Daniels
*Assistant Examiner* — Russell Kemmerle, III
(74) *Attorney, Agent, or Firm* — Greenblum & Bernstein, P.L.C.

(57) ABSTRACT

In order to provide method and apparatus for manufacturing a vitreous silica crucible with little mixing of foreign matter and stable arc during arc melting, the method and apparatus for manufacturing a vitreous silica crucible have a device which blows off air from the side of arc electrodes toward a melting space of a mold, and air discharge ports which discharge the air within the heating furnace, and perform forced supply of air into the melting space during melting to make the atmospheric pressure of the melting space higher than the surroundings, and preferably, form an air pressure difference of 100 Pa or more between the melting space and the surroundings, thereby performing melting.

8 Claims, 4 Drawing Sheets

METHOD AND APPARATUS FOR MANUFACTURING VITREOUS SILICA CRUCIBLE

TECHNICAL FIELD

The present invention relates to method and apparatus for manufacturing a vitreous silica crucible with little mixing of foreign matter and stable arc during arc melting in manufacturing of the vitreous silica crucible by a rotary mold method.

Priority is claimed on Japanese Patent Application No. 2007-196814, filed Jul. 28, 2007, the content of which is incorporated herein by reference.

BACKGROUND ART

Generally, single-crystal silicon is pulled and manufactured from silicone melt stored in a vitreous silica crucible under high temperature. A rotary mold method is known as a method for manufacturing a vitreous silica crucible (Japanese Patent No. 1257513 (Japanese Unexamined Patent Application Publication No. 59-34659)). This method obtains a targeted crucible by depositing a predetermined thickness of silica powder on an inner surface of a hollow mold (bowl type) to rotate, melting and vitrifying this silica powder under high temperature by arc discharge, etc., forming the silica powder in the shape of a crucible along the inner surface of the mold, and removing the formed crucible after cooling.

An apparatus used for manufacture of the above vitreous silica crucible includes a heating furnace which houses a mold, and has a structure in which a supporting stand for arc electrodes is provided in an upper portion within the heating furnace, the arc electrodes are provided downward toward the inside of the mold in the middle of this supporting stand, and a silica powder layer deposited on the inner surface of the mold is heated and melted by arc discharge.

A predetermined thickness of silica powder as a raw material is deposited on an inner surface of a rotary mold, the mold on which the silica powder is deposited is housed in the heating furnace, the inside of the furnace is closed, and the silica powder is heated, melted, and vitrified by arc discharge while the mold is rotated, thereby manufacturing a vitreous silica crucible.

DISCLOSURE OF THE INVENTION

Problems to be Solved by the Invention

A conventional arc melting furnace which manufactures a vitreous silica crucible has a large volume of discharged air in order to rapidly discharge exhaust heat or silica fumes generated to the outside of the furnace, and the inside of the furnace is in a pressure-reduced state. For this reason, foreign matter is sucked from the outside during arc melting, and this is mixed into the crucible, which is one of the factors which lowers the yield. Additionally, silica fumes which are not discharged adhere to the electrodes and the furnace, and these are peeled off and mixed into the crucible, which is also a factor which lowers the yield.

The invention provides a manufacturing method and apparatus which have solved the above conventional problems, and provides a method and apparatus for manufacturing a vitreous silica crucible with little mixing of foreign matter and stable arc during arc melting.

Means for Solving the Problems

The invention relates to a method for manufacturing a vitreous silica crucible which has solved the conventional problems by the following constructions.

(1) A method for manufacturing a vitreous silica crucible by heating, melting, and vitrifying a silica powder layer deposited on an inner surface of a melting space of a mold, wherein forced supply of air into the melting space is performed during melting to perform the heating and melting in a state where the atmospheric pressure of the melting space is higher than the outside of the melting space.

(2) The method for manufacturing a vitreous silica crucible according to the above (1), wherein forced supply of air into the melting space is performed during the heating and melting to make the atmospheric pressure of the melting space higher than the surroundings, and form an air pressure difference of 100 Pa or more between the melting space and the surroundings.

Moreover, the invention relates to an apparatus for manufacturing a vitreous silica crucible which has solved the conventional problems by the following construction.

(3) An apparatus comprising a heating furnace which houses a mold having a melting space therein, and arc electrodes directed to the melting space inside the mold being provided within the heating furnace, the apparatus for manufacturing a vitreous silica crucible by heating, melting, and vitrifying a silica powder layer deposited on an inner surface of the melting space of the mold by arc discharge, wherein a device which blows off air from the side of the arc electrodes toward the melting space of the mold, and air discharge ports which discharge the air within the heating furnace below blowout ports of the air blow-off device are provided.

Advantages of the Invention

The manufacturing method of the invention is a method for manufacturing a vitreous silica crucible by heating, melting, and vitrifying a silica powder layer deposited on an inner surface of a mold. In this method, forced supply of air into a melting space is performed during melting to make the atmospheric pressure of the melting space higher than the outside of the melting space, and for example form an air pressure difference of 100 Pa or more between the melting space and the outside of the melting space. Thus, a high-quality crucible can be manufactured without mixing of foreign matter into the crucible during arc melting.

Conventionally, as for the stream of air at the time of arc discharge, a stream of air that expands by arc heating goes from an arc portion to a space right above the arc portion (the direction of the electrodes) and a stream which is blown off upward along an inner wall of the mold form turbulence in an upper portion of the mold. When the silica fumes adhered to the electrodes are peeled off and fall due to this turbulence, they will adhere to the vitreous silica, and will become foreign matter.

On the other hand, in the manufacturing method of the invention, the circumference of the electrodes is surrounded by an air stream of forced supply air as air is blown into the mold by forced air supply from the side of the arc electrodes. Thus, adhesion of the silica fumes to the electrodes is prevented. Moreover, since the air forced into the mold is discharged out of the mold not from the vicinity of the center of the mold but from only the vicinity of an inner peripheral surface of the mold, the expanded air has no stream which is directed from an arc portion to the electrodes right above the arc portion, hardly any turbulence is generated.

In the manufacturing apparatus of the invention, air forced supply of air into the melting space can be performed during melting by the device which blows off air from the side of the arc electrodes toward the inside of the mold, and mixing of foreign matter into the crucible during arc melting can be prevented.

Additionally, since the air discharge passages along with the above forced air supply device are formed below the blowout ports of the air blow-off device, the air which has flowed out of the mold is directed to the air discharge passages as a downward stream. Thus, no turbulence is generated on the mold, and excellent discharge effects of exhaust heat and silica fumes are exhibited. Additionally, since an air stream within the melting space and the furnace is stabilized, a crucible with stable and homogenous arcs can be manufactured.

REFERENCE NUMERALS

10: MOLD
20: HEATING FURNACE
21: ELECTRODE
22: SUPPORTING STAND
23: AIR SUPPLY DUCT
24: SIDE WALL
25: AIR DISCHARGE PASSAGE
26: REAR WALL
27: DOOR
30: SILICA POWDER LAYER
C: VITREOUS SILICA CRUCIBLE

BEST MODE FOR CARRYING OUT THE INVENTION

Hereinafter, one embodiment of a method and apparatus for manufacturing a vitreous silica crucible related to the invention will be described with reference to the drawings.

Figure 1:
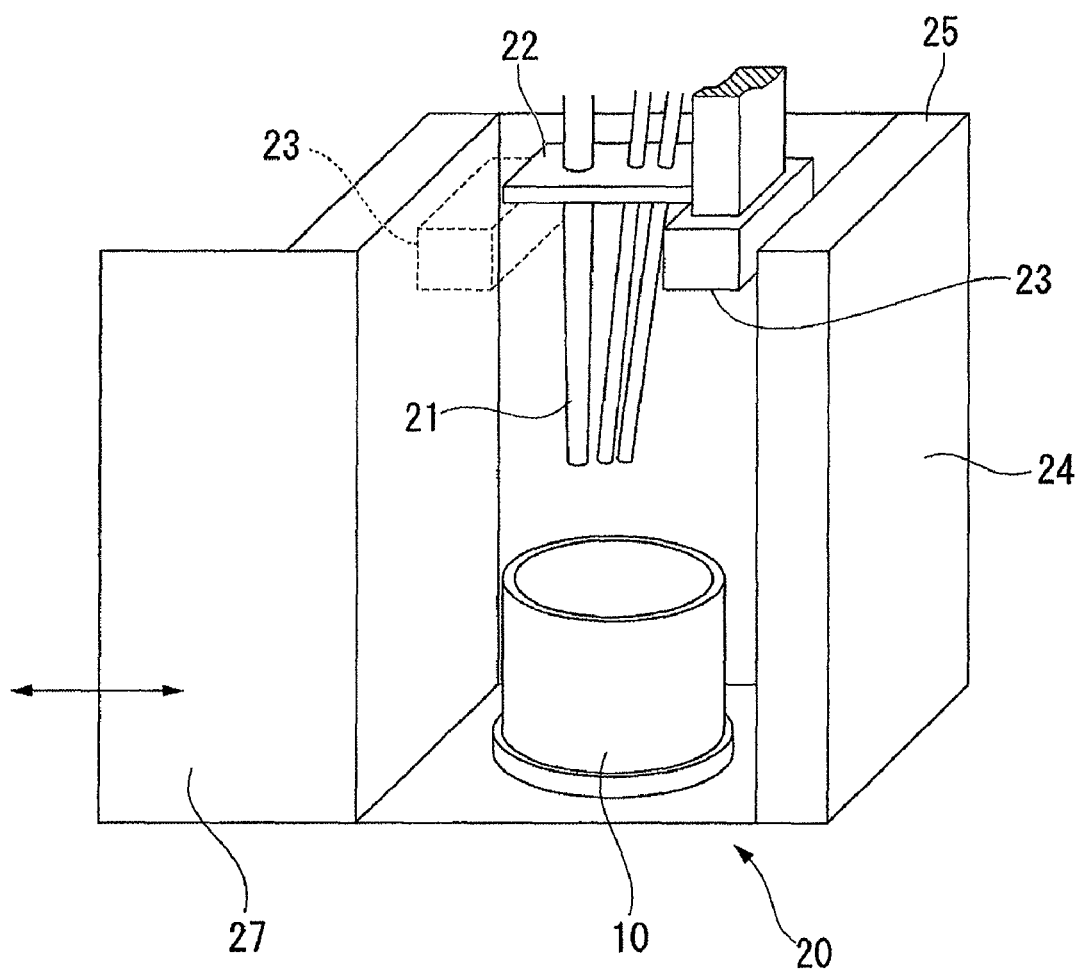
FIG. 1 is a schematic perspective view showing an apparatus for manufacturing a vitreous silica crucible related to the invention.
Figure 2:
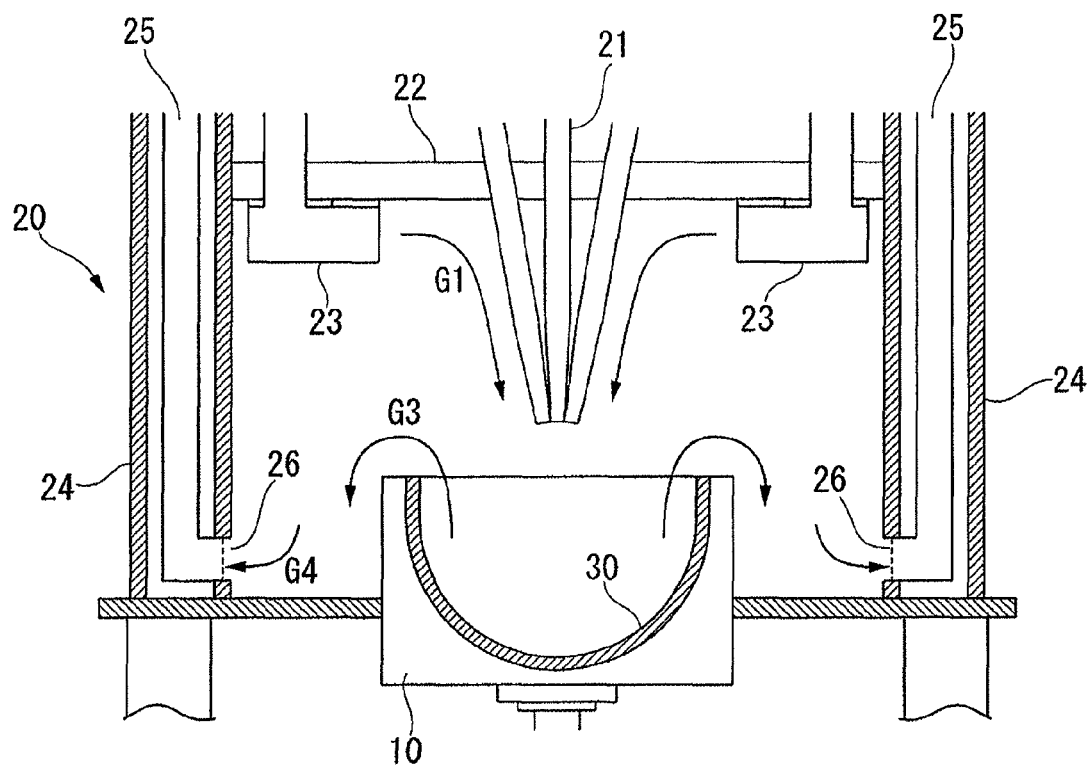
FIG. 2 is a schematic sectional view of a melting structural portion of the apparatus for manufacturing a vitreous silica crucible related to the invention.
Figure 3:
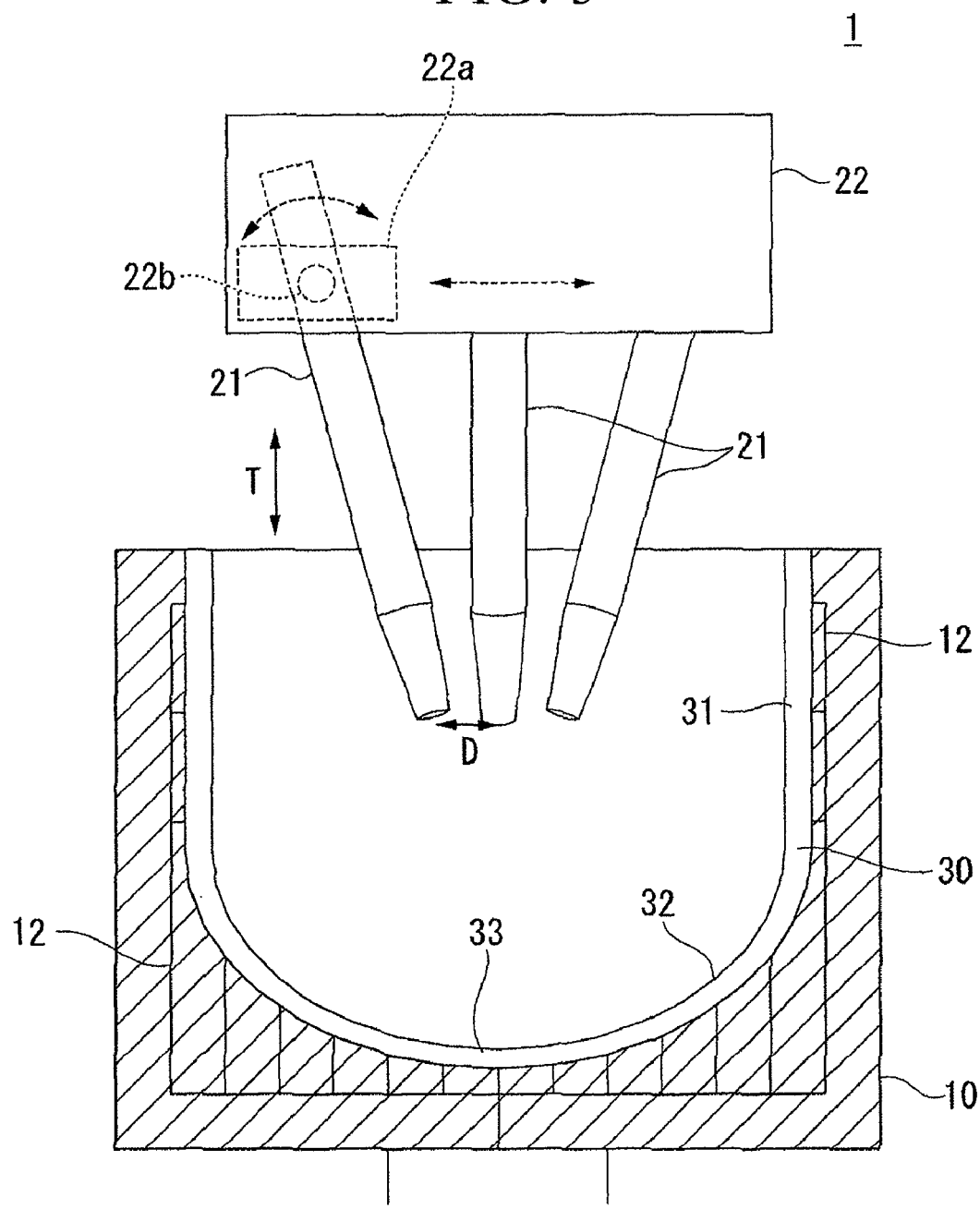
FIG. 3 is a front view showing the positional relationship between a mold and electrodes under arc discharge in the apparatus for manufacturing a vitreous silica crucible of FIGS. 1 and 2.
Figure 4:
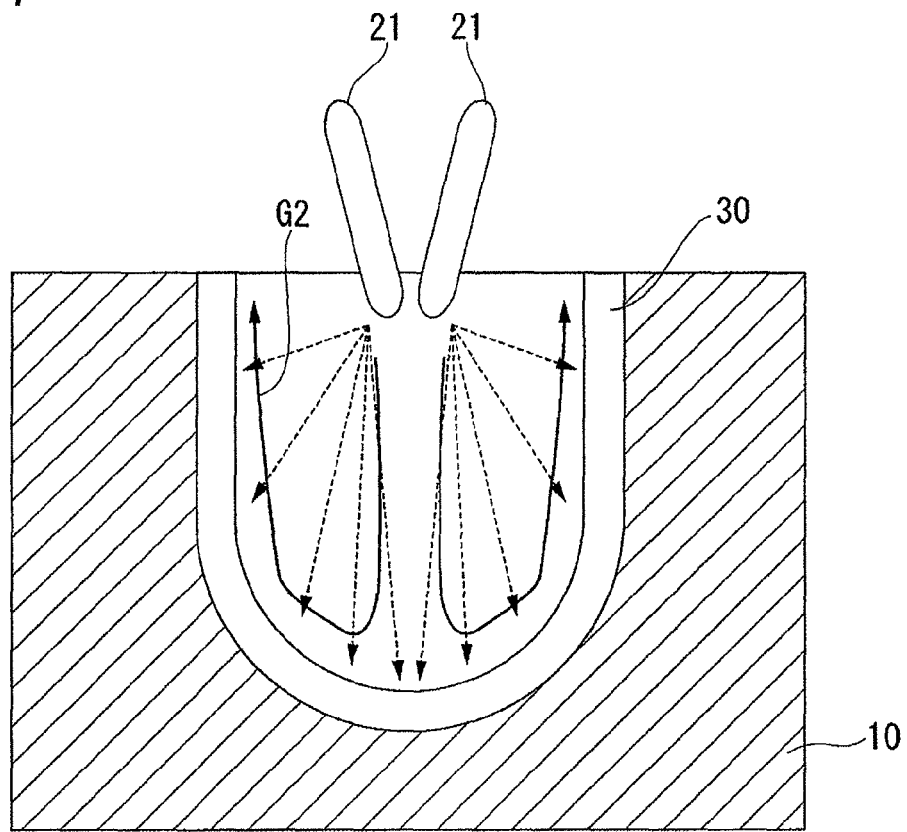
FIG. 4 is a view schematically showing the relationship between the mold and the electrodes, and a gas stream under arc discharge in the apparatus for manufacturing a vitreous silica crucible of FIGS. 1 and 2.
Figure 5:
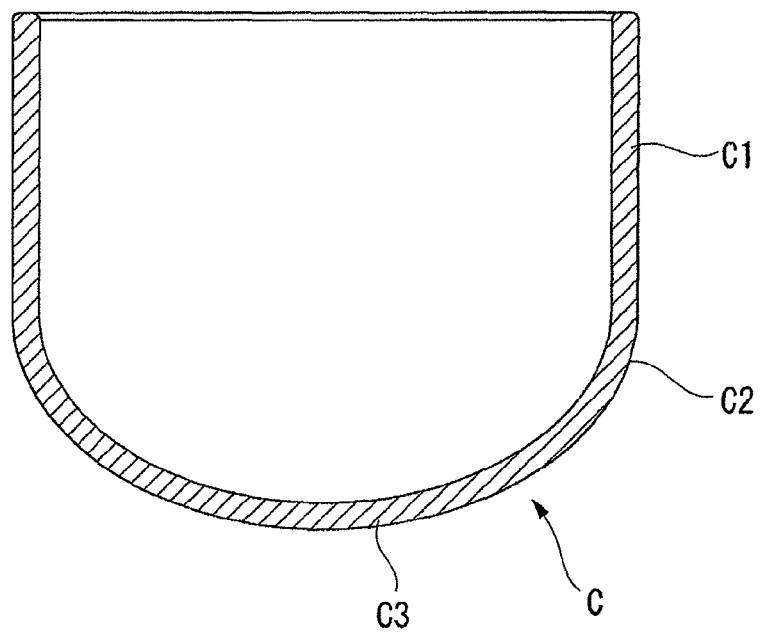
FIG. 5 is a front sectional view showing a vitreous silica crucible manufactured by the method for manufacturing a vitreous silica crucible related to one embodiment of the invention.

FIG. 1 is a schematic perspective view showing an example of an apparatus for manufacturing a vitreous silica crucible related to an embodiment of the invention, FIG. 2 is a schematic front view when a melting mechanism portion in the apparatus for manufacturing a vitreous silica crucible of FIG. 1 is seen in section, FIG. 3 is a front view showing the positional relationship between a mold and electrodes of FIGS. 1 and 2 under arc discharge, FIG. 4 is a front view showing the relationship between the mold and the electrodes, and a gas stream under arc discharge of FIGS. 1 and 2, and FIG. 5 is a front sectional view showing a vitreous silica crucible manufactured by the method for manufacturing a vitreous silica crucible related to one embodiment of the invention.

The apparatus for manufacturing a vitreous silica crucible in this embodiment, as shown in FIG. 1, generally includes a mold 10 which has a melting space for melting silica powder to form a vitreous silica crucible therein, a drive mechanism 11 which rotates the mold 10 around the axis thereof, and a heating furnace 20 which houses the mold 10, and has an arc discharge device for heating the inside of the mold 10.

The heating furnace 20, as shown in FIGS. 1 to 3, has an arc discharge device which has electrodes 21 which perform arc discharge which heats a silica powder layer 30 in the mold 10, and a shielding device made up of side walls 24 which house the electrodes 21 and the mold 10, and are provided in the shape of a rectangular parallelepiped for reducing and cutting off transfer of heat or the like to be generated to the outside, a device which shields the upside of the heating furnace 20 to be described, and a door 27 which is provided at a front opening so as to be openable and closable.

The heating furnace 20 is adapted to be able to shut the door 27 to close the inside of the furnace, at the time of arc melting.

The mold 10 is able to enter and leave the heating furnace 20. For example, the silica powder layer 30 is formed on an inner surface of the mold 10 outside the heating furnace 20, and the mold 10 in which the silica powder layer 30 is formed is loaded into the heating furnace 20, thereby performing heat melting of the silica powder 30. The mold 10 is rotatable. Silica powder is pressed against and is deposited on the inner surface of the mold by the rotation centrifugal force of the mold, thereby forming a silica powder layer with a predetermined thickness.

The mold 10, as shown in FIGS. 1 to 3, is formed from, for example, carbon, and a number of pressure-reducing passages 12 opened to the inner surface of the mold 10 are formed within the mold. A pressure-reducing mechanism (not shown) is connected to the pressure-reducing passages 12, and the mold 10 is adapted to be able to suck air through the pressure-reducing passages 12 from the inner surface of the mold when being rotated. The silica powder layer 30 can be formed on the inner surface of a mold 10 by depositing raw silica powder. The silica powder layer 30 is held on the inner wall face of the mold by a centrifugal force resulting from the rotation of the mold 10. By reducing pressure through the pressure-reducing passages 12 while heating the held silica powder layer 30 by an arc discharge device, the silica powder layer 30 melts and a vitreous silica layer is formed. A vitreous silica crucible is manufactured by taking out the vitreous silica crucible from the mold 10, and shaping it after cooling.

The electrodes 21 which perform arc discharge are provided in an upper portion within the heating furnace 20. In the illustrated example, the electrodes 21 are formed by a combination of three poles. The electrodes 21 constitute the shielding device which is mounted on the supporting stand 22 of the upper portion within the furnace and shields the inside of the furnace, is located in the middle of the supporting stand 22, and is installed so as to project downward toward the mold 10 in an arc melting position from the supporting stand 22. The supporting stand 22 is provided with a device (not shown) which moves the electrodes 21 up and down, and when the mold 10 enters and leaves the furnace, the electrodes 21 are pulled upward, and during arc melting, the electrodes 21 come down toward the mold.

Additionally, the supporting stand 22 has a supporting portion 22a which supports each carbon electrode 21 so that the distance between the electrodes can be set, a horizontally moving device which allows the supporting portion 22a to be horizontally moved, and a vertically moving device which allows a plurality of supporting portions 22a and their horizontally moving device to be integrally moved in a vertical direction. In the supporting portion 22a, the carbon electrode 21 is supported so as to be rotatable around an angle setting shaft 22b, and a rotary device which controls the angle of rotation of the angle setting shaft 22b is provided. In order to adjust the electrode distance between the carbon electrodes 21 and 21, the angle of the carbon electrode 21 is controlled by the rotary device, and the horizontal position of the supporting portion 22a is controlled by the horizontally moving device. Additionally, it becomes possible to control the height position of the supporting portion 22a by the vertically moving device and control the height position of a tip portion of the electrode with respect to the position of the bottom portion of the silica powder layer 30. In addition, although the supporting portion 22a or the like is shown in the drawing only in the carbon electrode 21 at the left end, other electrodes are also supported by the same construction, and the height of individual carbon electrodes 21 can also be controlled individually.

The arc discharge device, as shown in FIGS. 1 to 3, includes a plurality of rod-shaped electrodes (carbon electrodes) 21 which are formed from highly-pure carbon, electrode moving mechanisms 22a and 22b which hold and move the carbon electrode 21, and a power unit (not shown) for applying a current to each carbon electrode 21 within an output range of 300 kVA to 12,000 kVA.

The carbon electrodes 21, 21, and 21 are formed as electrode rods of the same shape so as to perform, for example, arc discharge of an alternating-current three phase circuit (R phase, S phase, T phase), and as shown in FIGS. 1 to 3, the electrodes are provided so as to assume an inverted triangular pyramidal shape which has an apex on the lower side. Although the number of carbon electrodes 21 is three in this embodiment, two or four electrodes may be provided as long as arc discharge is performed between the carbon electrodes 2. The shape of the carbon electrodes 21 is not limited, either. The carbon electrodes 21 are arranged so as to approach each other toward their tips. The power may be an alternating current or may be a direct current.

The manufacturing apparatus of this embodiment is formed with a forced air supply device which blows off air from lateral positions of the electrodes 21 via the vicinity of the electrodes 21 toward the melting space inside the mold 10, and an air discharging device which discharges the air within the heating furnace.

In the illustrated example, specifically, an air supply duct 23 is provided at the side of the electrodes 21 below the supporting stand 22. The air supply duct 23 is connected to an air supply device (not shown) outside the furnace through the upper portion within the furnace. The air supply ducts 23 are provided in two places on both sides of the electrodes 21, are set such that their distances from the electrodes 21 are equal to each other, and are set such that the electrodes 21 are located almost in the middle of both the supply ducts 23 and the central axis of the mold 10 during arc melting are coinciding with the center position of the electrodes 21 in plan view.

The tip of each of the air supply ducts 23 is opened toward the electrodes 21, and is adapted to be able to supply air into the furnace through the air supply ducts 23 by a pressure higher than the pressure (forced air supply) within the furnace. The air blown from the air supply ducts 23 flows toward the electrodes 21. The air blown to the vicinity of the electrodes 21 during arc discharge flows down along the electrodes 21 under the influence of an arc flame generated in the vicinity of the electrodes 21, and flows toward the melting space inside the mold installed below the electrodes 21. As such, the air supply duct 23, and the electrodes 21 under arc discharge constitute a forced air supply device which pressurizes the inside of the melting space within the mold 10 so that the pressure of the melting space inside the mold may be kept higher than the surroundings due to the inflow of this pressurized air. The air jetted out from the air supply duct 23 is set such that the atmospheric pressure of the melting space forms an air pressure difference 100 Pa or higher than the surroundings of the melting space.

In this embodiment, although two supply ducts 23 are provided on both sides of the electrodes 21, the invention is not limited to this construction as long as an arrangement allowing forced air supply toward the electrodes 21 is provided. It is possible to adopt an arrangement in which air supply ducts are provided in a plurality of places, such as three places which are symmetrical with respect to the electrodes 21 in plan view, and the air which has flowed out of the air supply ducts 23 can join together in the vicinity of the electrodes 21.

The apparatus for manufacturing a vitreous silica crucible in this embodiment is formed with an air discharging device which discharges the air within the heating furnace by the above forced air supply device. As the air discharging device, as shown in FIG. 1, the side walls 24 of the heating furnace 20 are formed doubly, and air discharge passages 25 are provided inside the side walls 24. The air discharge passages 25, as shown in FIG. 1, may be formed in the side walls on both sides of the heating furnace 20, but may be formed at a rear wall along with both the side walls. By forming the air discharge passages with the side walls 24 as a double structure in this way, the air discharge passages 25 can be protected from the heat within the furnace, and transfer of heat, noise, etc. generated within the furnace to the outside can be reduced. The side walls 24 of the heating furnace 20 are provided with air discharge ports 26 of the air discharge passages 25.

The above air discharge ports 26 are provided below blow-out ports of the above air supply ducts 23. Preferably, the air discharge ports 26 are provided in positions lower than an upper end of the mold 10. The length dimension of the air discharge ports 26 is a dimension in the front-back direction shown in FIG. 1, and is set so as to be at least larger than the shape dimension of the mold 10. By providing the air discharge ports 26 on the lower side, the air which has flowed out of the mold 10 is directed toward the air discharge passages mainly as a downward stream, and silica fumes included in the discharged air are not easily scattered upward. Thus, it becomes possible to reduce silica fumes adhering to a ceiling portion and the electrodes.

Hereinafter, a method for manufacturing a vitreous silica crucible related to this embodiment will be described.

The method for manufacturing a vitreous silica crucible of this embodiment has a filling step of filling the mold 10 with raw powder outside the heating furnace 20 to mold a compact 30 which is a silica powder layer, a loading step of loading and moving the mold 10 filled with the silica powder layer 30 into the heating furnace 20, an electrode position setting step of setting the positions of the electrodes 21, a melting step of supplying electric power to the electrodes 21 to start arc discharge and arc-melt the raw powder, an air supply starting step of starting forced air supply from the air supply ducts 23, an air supply stopping step of stopping the air supply from the air supply ducts 23 after the end of melting, and a unloading step of unloading the mold 10.

In the filling step, the mold 10 is filled with silica powder (raw powder) outside the heating furnace 20, and the silica powder layer 30 is molded in a desired state.

In the loading step, the mold 10 filled with the silica powder layer 30 is loaded into the heating furnace 20 in which the door 27 is opened, by a moving device (not shown), and the door 27 is closed. In this case, the electrodes 21 are set in upper height positions at the time of loading so that there may be no hindrance to loading of the mold 10.

In the electrode position setting step, the electrodes 21 are made to descend from their height positions at the time of loading by the vertically moving device, and are set in height positions at the time of starting of arcs suitable for starting arc melting.

In the melting step, electric power is supplied to the electrodes 21, thereby starting arc discharge and arc-melting the raw powder.

In the air supply starting step, after the start of supply of electric power, an air stream is jetted out from the air supply ducts 23 by an air supply device, thereby pressurizing the inside of the melting space. In a case where gas is jetted out before the supply of electric power, it is not preferable because there is a possibility that the surface of the silica powder layer 30 may change from a set state, such as scattering of silica powder.

In this case, the air stream jetted out from the air supply ducts 23 is controlled so that the inside of the melting space may have an air pressure difference of 100 Pa or higher than that of the surroundings and this air pressure difference may be maintained.

To describe the control by the air supply device in the melting step in more detail, a gas stream in the melting space under arc melting descends from the tip positions of the electrodes 21 near the center portion of the mold 10 within the melting space, as indicated by a solid arrow line in FIG. 4, is headed substantially horizontally outward in the vicinity of the lowermost portion of the silica powder layer 30 used as a bottom portion C3 of the crucible, ascends along a wall portion C1 of a curved portion C2 of the crucible, and outside the mold 10, descends and is directed to the air discharge ports 26.

By jetting out gas to the electrodes 21 from the air supply ducts 23 in this way, it becomes possible to prevent discharge air containing silica fumes discharged to the outside from the melting space from reaching the electrodes 21 or the like, thereby reducing the silica fumes adhering to a ceiling portion and the electrodes.

By controlling the amount of supply of blast gas in this way, thereby controlling the stream of gas indicated by the solid arrows shown in FIG. 4 with respect to radiated heat from the electrodes 21 indicated by broken lines in FIG. 4, it is possible to make the temperature distribution within the surface of the silica powder layer 30 into a desirable state, and manufacture a homogeneous vitreous silica crucible. Here, the term "homogeneous" means that surface characteristics of a vitreous silica crucible do not vary depending on a position in a surface. The surface characteristics of a vitreous silica crucible means factors which influence characteristics of semiconductor single crystals pulled by the vitreous silica crucible, such as a vitrified state in the surface within the crucible, the bubble distribution in a thickness direction and the size of bubbles, the content of OH groups, impurity distribution, irregularities of a surface, and a distribution state, such as the unevenness of the irregularities in the height direction of the crucible.

By setting the atmospheric pressure of the melting space higher than the surroundings in the melting step, it is possible to prevent the foreign matter scattered from the surroundings from flowing into the melting space. The atmospheric pressure of a melting space preferably forms an air pressure difference of 100 Pa or higher than the surroundings of the melting space. Since the atmospheric pressure of a melting space is 100 Pa or higher than the surroundings, forced supply air covers the whole melting space and an air stream does not flow into the meting space from the surroundings. Thus, mixing of the foreign matter into the melting space can be prevented reliably. In addition, as the air introduced into the furnace, it is preferable to introduce the air which is pressurized such that the above air pressure difference is formed.

In the air supply stopping step, the air supply from the air supply ducts 23 is stopped simultaneously with the end of supply of electric power or simultaneously with the end of melting. Additionally, in a case where the gas from the air supply ducts 23 is used for cooling of the vitreous silica crucible, air supply can be stopped after a required cool-down time has lapsed.

In the unloading step, the door 27 is opened, the mold 10 is unloaded, and required shaping processing, such as rim cutting and inner surface treatment, is performed, thereby manufacturing the vitreous silica crucible C shown in FIG. 5.

FIG. 5 shows an example of the vitreous silica crucible. This vitreous silica crucible C is made up of a wall portion C1, a curved portion C2, and a bottom portion C3. In this embodiment, by combining the positions of the electrodes 21 at the time of arc melting, supply power, the quantity of gas jetted out from the air supply ducts 23, and controlling them according to a molten state, it is possible to manufacture a vitreous silica crucible with the inner surface characteristics of the vitreous silica crucible C in desired states, such as a state where inner surface characteristics in the wall portion C1, the curved portion C2, and the bottom portion C3 are uniform, or a state where the surface roughness of only an upper portion of the wall portion C1 is high.

INDUSTRIAL APPLICABILITY

The apparatus for manufacturing a vitreous silica crucible in this embodiment is formed with a device which discharges the air within a furnace along with a forced air supply device. Thus, mixing of foreign matter into the melting space can be prevented reliably, the discharge effects of exhaust heat and silica fumes are excellent, and the air stream within the melting space and the furnace is stabilized. Thus, the manufacturing apparatus has industrial applicability because a vitreous silica crucible with stable and homogeneous arcs can be manufactured.

The method for manufacturing a vitreous silica crucible in this embodiment is a method for manufacturing a vitreous silica crucible by heating, melting, and vitrifying a silica powder layer deposited on an inner surface of a mold. In this method, forced supply of air into a melting space is performed during melting to make the atmospheric pressure of the melting space higher than the outside of the melting space, and for example form an air pressure difference of 100 Pa or more between the melting space and the outside of the melting space. Thus, the manufacturing method has industrial applicability because a high-quality crucible can be manufactured without mixing of foreign matter into the crucible during arc melting.

The invention claimed is:

1. A method for manufacturing a vitreous silica crucible by using a plurality of electrodes for heating, melting, and vitrifying a silica powder layer deposited on an inner surface of a melting space of a mold, wherein forced supply of air into the melting space is performed during melting to surround the circumference of the electrodes and to perform the heating and melting in a state where the atmospheric pressure of the melting space is higher than the outside of the melting space, and an air pressure difference of 100 Pa or more is formed between the melting space and the surroundings, and the air is discharged from the heating furnace below blowout ports.

2. The method for manufacturing a vitreous silica crucible according to claim 1, wherein the air is forced into the melting space from the side of the electrodes.

3. An apparatus comprising a heating furnace which houses a mold having a melting space therein, and arc electrodes directed to the melting space inside the mold being provided within the heating furnace, the apparatus for manufacturing a vitreous silica crucible by heating, melting, and vitrifying a silica powder layer deposited on an inner surface of a melting space of a mold by arc discharge, wherein a device which blows off air from the side of the arc electrodes toward the melting space of the mold such that the air surrounds the circumference of the arc electrodes, an air pressure difference of 100 Pa or more is formed between the melting space and the surroundings, and air discharge ports which discharge the air within the heating furnace below blowout ports of the air blow-off device are provided.

4. The method for manufacturing a vitreous silica crucible according to claim 1, wherein the mold is housed in a heating furnace, and air discharge ports are provided with the heating furnace.

5. The method for manufacturing a vitreous silica crucible according to claim 4, wherein the air is discharged from the heating furnace below an upper end of the mold.

6. The method for manufacturing a vitreous silica crucible according to claim 5, wherein arc electrodes are housed in a heating furnace, and air is blown off from the side of the arc electrodes toward the melting space of the mold.

7. The apparatus according to claim 3, wherein air discharge ports are provided with the heating furnace.

8. The apparatus according to claim 7, wherein air discharge ports are provided in positions lower than an upper end of the mold.

* * * * *